US007733191B2

(12) United States Patent
Olmos et al.

(10) Patent No.: US 7,733,191 B2
(45) Date of Patent: Jun. 8, 2010

(54) OSCILLATOR DEVICES AND METHODS THEREOF

(75) Inventors: Alfredo Olmos, Campinas (BR); Jefferson Daniel De Barros Soldera, Campinas (BR); Gang Qian, Teda (CN); Michael Todd Berens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 201 days.

(21) Appl. No.: 11/680,218

(22) Filed: Feb. 28, 2007

(65) Prior Publication Data
US 2008/0204155 A1    Aug. 28, 2008

(51) Int. Cl.
*H03K 3/26* (2006.01)
(52) U.S. Cl. .................... 331/111; 331/143; 331/176
(58) Field of Classification Search ................ 331/34, 331/108 R, 111, 143, 176, 177 R
See application file for complete search history.

(56) References Cited
U.S. PATENT DOCUMENTS

| 3,883,825 | A | 5/1975 | Cohen |
| 4,122,413 | A | 10/1978 | Chen |
| 4,370,628 | A | 1/1983 | Henderson et al. |
| 4,623,851 | A | 11/1986 | Abou |
| 4,623,852 | A | 11/1986 | Abou et al. |
| 4,785,262 | A | 11/1988 | Ryu et al. |
| 5,440,277 | A | * 8/1995 | Ewen et al. ............ 331/176 |
| 5,614,871 | A | * 3/1997 | Miyabe .................. 331/111 |
| 5,699,024 | A | * 12/1997 | Manlove et al. ........ 331/111 |
| 5,821,781 | A | 10/1998 | Rigazio |
| 6,020,792 | A | 2/2000 | Nolan et al. |
| 6,028,492 | A | * 2/2000 | Matsubara .............. 331/111 |
| 6,362,697 | B1 | * 3/2002 | Pulvirenti ............... 331/111 |
| 6,515,551 | B1 | * 2/2003 | Mar et al. ............... 331/111 |
| 6,870,433 | B2 | 3/2005 | Motz |
| 2006/0038625 | A1 | * 2/2006 | Ricard et al. ........... 331/143 |
| 2007/0188250 | A1 | * 8/2007 | Gerber et al. ........... 331/36 C |
| 2008/0042765 | A1 | * 2/2008 | Tarng et al. ............. 331/167 |

FOREIGN PATENT DOCUMENTS
EP     0808021 A1    11/1997

* cited by examiner

*Primary Examiner*—Vibol Tan
*Assistant Examiner*—Jany Tran

(57) ABSTRACT

Oscillator devices and methods of operating such oscillator devices are disclosed. The oscillator devices include a current source, and an oscillation module to provide a clock signal. The frequency of the clock signal depends on the relationship between a threshold voltage of a transistor at the oscillation module and the current level provided by the current source. The transistor at the oscillation module is matched to a transistor at the current source so that the frequency of the clock signal is relatively insensitive to changes in device temperature.

14 Claims, 5 Drawing Sheets

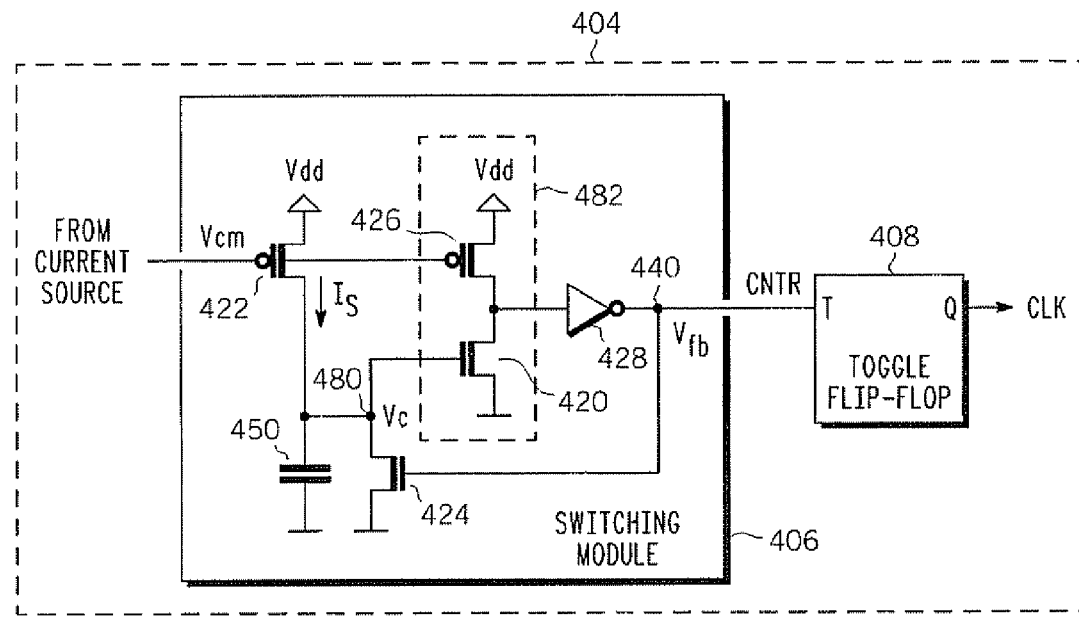
FIG. 4
FIG. 5
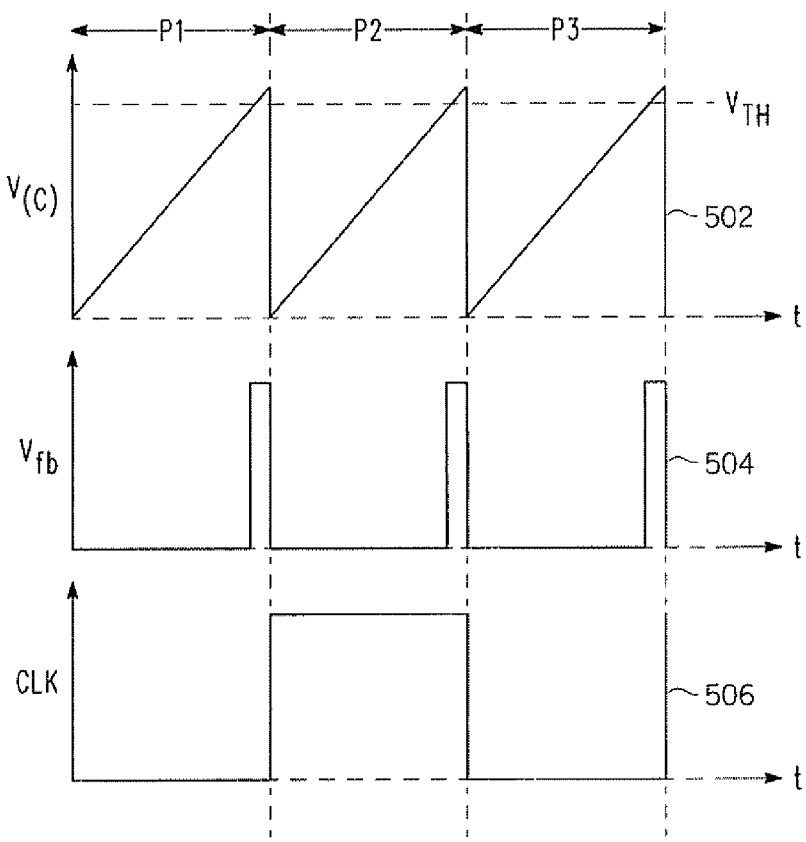

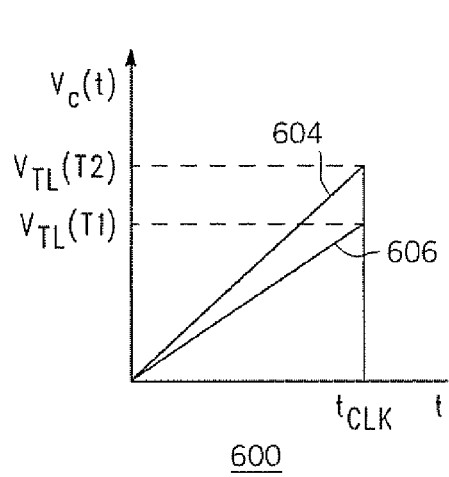
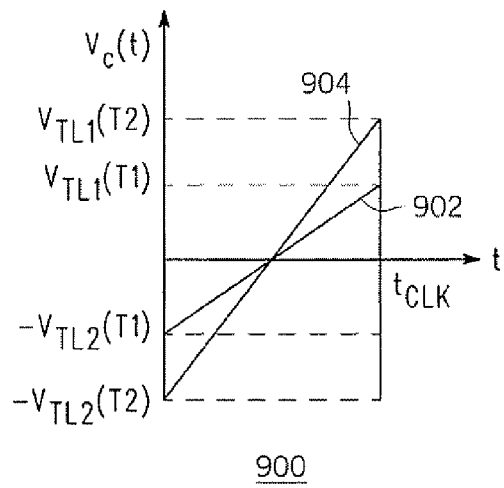
*FIG. 6*      *FIG. 9*
*FIG. 10*
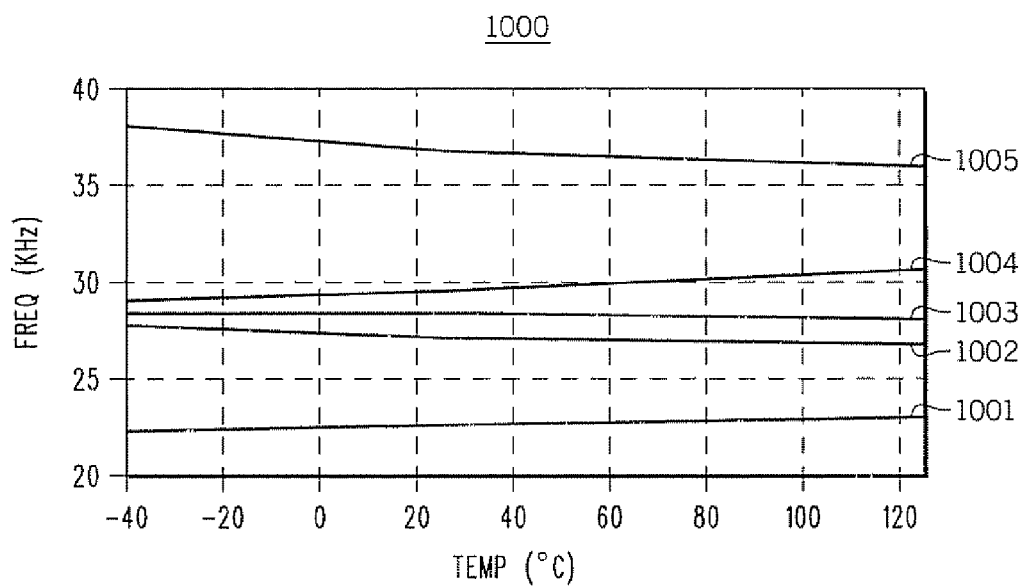

US 7,733,191 B2

OSCILLATOR DEVICES AND METHODS THEREOF

FIELD OF THE DISCLOSURE

The present disclosure is related generally to oscillator devices and more particularly to oscillator devices for generating clock signals.

BACKGROUND

Semiconductor devices are known to use oscillators to generate clock signals to control operation of these devices. In order for device using oscillator circuits to function properly, it is generally desirable that the frequency of the oscillator circuit's clock signal remain within specified tolerances over extended temperature changes. However, the ability to compensate for expected temperature changes is more difficult at low voltages such as voltages desirable during various low power modes of operation. Accordingly, an improved oscillator and methods of operating at low voltages would be advantageous.

BRIEF DESCRIPTION OF THE DRAWINGS

FIG. 4 is a circuit and block diagram illustrating a particular embodiment of the oscillation module of FIG. 2;

FIG. 5 is a timing diagram illustrating a particular embodiment of the operation of the switching module of FIG. 4;

FIG. 6 is a diagram illustrating the operation of the device of FIG. 4 at two different temperatures;

FIG. 9 is a diagram illustrating the operation of the device of FIG. 7 at two different temperatures.

FIG. 10 is a plot illustrating clock frequencies as a function of temperature according to one embodiment.

DESCRIPTION OF THE EMBODIMENT(S)

Oscillator devices and methods of operating such oscillator devices are disclosed. The oscillator devices include a current source and an oscillation module to provide a clock signal. The frequency of the clock signal depends on the relationship between a threshold voltage of a transistor at the oscillation module and the current level provided by the current source. The transistor at the oscillation module is matched to a transistor at the current source so that the frequency of the clock signal is relatively insensitive to changes in device temperature.

Figure 1:
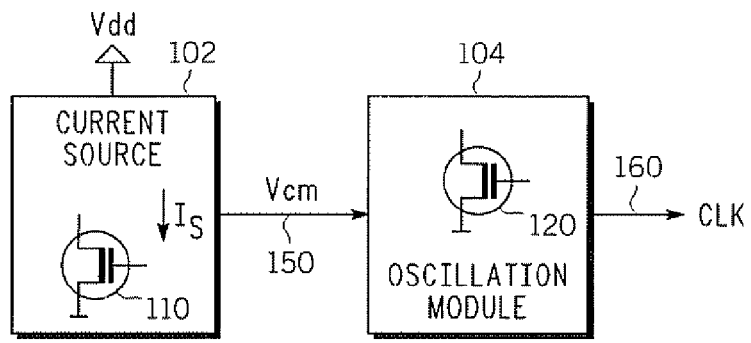
FIG. 1 is a block diagram illustrating an oscillation device in accordance with one embodiment of the present disclosure.

Referring to FIG. 1, a block diagram of a device 100 according to one particular embodiment is illustrated. Device 100 can be implement as a system-on-chip (SOC) device, or a device containing an SOC. The device 100 includes a current source 102 and an oscillation module 104 connected to the current source 102 via a current source output 150. The current source 102 generates a current $I_S$ and provides a voltage $V_{CM}$ to current mirrors at the oscillation module 104 to provide the current $I_S$. The oscillation module 104 further includes an output 160 to provide a clock signal (CLK). The current source 102 includes a transistor 110 having a first current electrode, a control electrode, and a second current electrode connected to a ground. The oscillation module 104 includes a transistor 120 having a first current electrode, a control electrode, and a second current electrode connected to a ground voltage reference.

During operation, the output 160 of the oscillation module 104 provides the clock signal, labeled CLK, to downstream circuitry. The frequency of the clock signal CLK is based in part on the relationship between the level of the current $I_S$ of the current source 102 and a threshold voltage of the transistor 120. In addition, the level of the current $I_S$ is based in part, upon the threshold voltage of transistor 110 and the voltage $V_{dd}$. A voltage $V_{CM}$ is provided to one or more current mirrors at the oscillation module 104, so that the current $I_S$ is generated at the oscillation module 104.

Transistor 110 and transistor 120 are matched devices. As used herein, the terms "matched" or "matching", when used with respect to transistors, is intended to refer to transistors that are made in a substantially identical process and are located in sufficiently close proximity to each other so that the operating characteristics of the transistors respond similarly to changes in the conditions of the device, such as changes in temperature. Because transistors 110 and 120 are matched, changes in the current $I_S$ due to temperature changes are compensated by a commensurate change in the threshold voltage of the transistor 120 to maintain a frequency of the clock signal CLK that is relatively insensitive to changes in temperature of the device 100.

Figure 2:
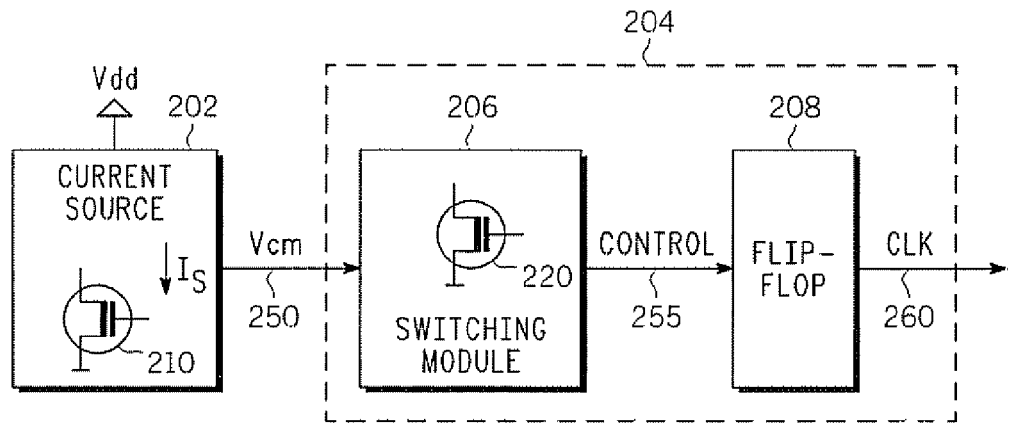
FIG. 2 is a block diagram illustrating a particular embodiment of the oscillation device of FIG. 1.

Referring to FIG. 2, a block diagram of a particular embodiment of a device 200 is illustrated. The device 200 includes a current source 202, and an oscillation module 204 that includes a switching module 206 and a latch 208. The latch 208 may be a flip-flop and the like. The latch 208 includes an output 260 to provide the signal CLK. The switching module 206 provides a control signal (CONTROL) to the latch 208 at output 255. The current source 202 provides a current $I_S$ to the switching module 206 via the current source output 250. The current source 202 includes a transistor 210. The switching module 206 includes a transistor 220.

During operation, the output 260 of the latch 208 provides a clock signal (CLK) to downstream circuitry. When the signal CONTROL is asserted, the output of the latch 208 is toggled between logic states. Accordingly, the timing of the assertion of the signal CONTROL determines the frequency of the signal CLK.

The timing of the assertion of the signal CONTROL is based on the relationship between a threshold voltage based on the threshold voltage of the transistor 220 and the level of current $I_S$, which is based in part on the threshold voltage of the transistor 210 and the voltage $V_{dd}$. The transistor 220 of the switching module 206 is matched to the transistor 210 of the current source 202, so that the changes in the threshold voltage of the transistor 220 due to changes in the temperature at the device 200 are matched by commensurate changes in the current $I_S$. Accordingly, temperature changes at the device 200 do not substantially affect the frequency of the signal CLK.

Figure 3:
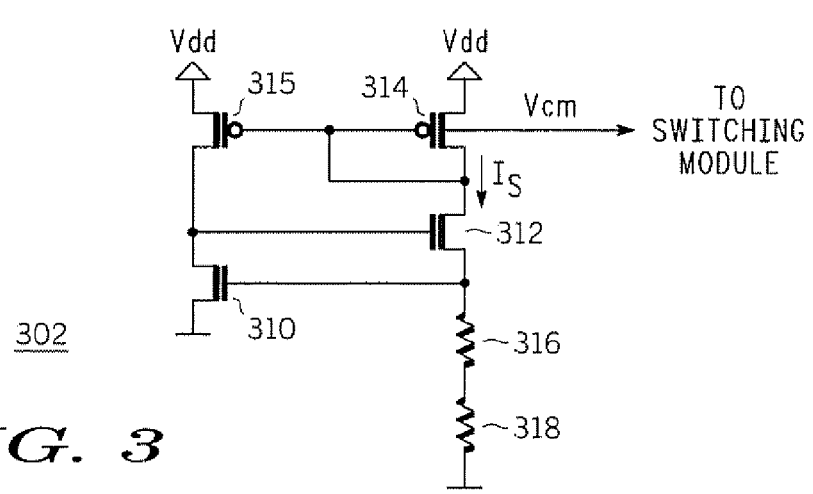
FIG. 3 is a block diagram illustrating a particular embodiment of the current source of FIG. 2.

Referring to FIG. 3, a block diagram of a particular embodiment of a current source 302, corresponding to the current source 202 of FIG. 2, is illustrated. The current source 302 includes transistors 310 (corresponding to transistor 210 of FIG. 2), 312, 314, and 315. Transistor 315 is a PMOS transistor having a first current electrode connected to a voltage reference ($V_{dd}$), a control electrode, and a second current electrode. The transistor 314 is a PMOS transistor having a first current electrode connected to the $V_{dd}$ voltage reference, a control electrode connected to the control electrode of the transistor 315, and a second current electrode connected to the control electrode of the transistor 315. The transistor 312 is an NMOS transistor having a first current electrode connected to the second current electrode of transistor 314 and to the control electrode of transistor 315, a control electrode, and a second current electrode. The transistor 310 is an NMOS transistor having a first current electrode connected to the control electrode of transistor 312, a control electrode connected to the second current electrode of the transistor 312, and a second current electrode connected to a voltage reference (ground). The current source 302 further includes a current source output connected to the control electrode of the transistor 315.

The current source further includes a resistance 316 and a resistance 318, which can include resistors or the like. Resistances 316 and 318 are connected in series and resistance 316 has a first electrode connected to the control electrode of the transistor 310 and the second current electrode of the transistor 312, and a second electrode. Resistance 318 has a first electrode connected to resistance 316 and a second electrode connected to a voltage reference (ground).

During operation, the current ($I_S$) is generated by the connection of the voltage references ($V_{dd}$) to the transistors 315 and 314, the intervening transistors 310 and 312, and the resistances 316 and 318. The voltage $V_{CM}$ is provided to current mirrors downstream modules to generate the current $I_S$ at those modules.

In the illustrated embodiment, the value of current $I_S$ is proportional to the ratio of the threshold voltage of transistor 310 ($V_{th310}$) and the sum of the resistive values of the resistances 316 and 318, as set forth in the following equation:

$$I_S \propto \frac{V_{th310}}{R_{316} + R_{318}}$$

Further, the resistances 316 and 318 have complementary temperature coefficients, as such, the total resistance of the resistances 316 and 318 does not significantly deviate with temperature. Further, the threshold voltage $V_{th310}$ varies conversely to temperature variation. Therefore, the temperature behavior of $I_S$ current depends primarily on the temperature dependency of the threshold voltage $V_{th310}$. For example, when the temperature rises the threshold voltage of device 310 on current source 302 decreases, leading to a decrease in the current $I_S$. However, because the transistor 120 in oscillation module 104 is matched with the transistor 310, the threshold voltages of the transistor 120 and the transistor 310 will have similar changes due to temperature. Accordingly, as the current $I_S$ decreases, due to a change in $V_{th310}$, the threshold voltage of the transistor 120 changes in the same proportion of device 310. Accordingly, the frequency of the signal CLK remains relatively constant over changes in temperature.

As explained, the resistances 316 and 318 of the current source 302 can be selected to have particular response characteristics in response to a change in temperature. This ensures that the temperature variation of $I_S$ is proportional to the variation over temperature of $V_{th310}$. In addition, the ratio between the resistance 316 and the resistance 318 can be selected to accurately set the level of $I_S$ for a desired frequency of the signal CLK. In a particular embodiment, resistance 316 is a doped resistor, such as a P-type doped resistor, or particularly a P+ doped poly resistor that has a resistance that is directly proportional to temperature. Accordingly, in another embodiment, the resistance 318 is a resistor, such as a doped resistor, and particularly an N-type doped resistor, and more particularly an N+ doped poly resistor having a resistance that is inversely proportional to temperature. In an alternative embodiment, the resistor 316 is a N+ doped poly resistor and resistor 318 is a P+ doped poly resistor.

Referring to FIG. 4, a block diagram of a particular embodiment of an oscillation module 404 is illustrated. The oscillation module 404 includes a switching module 406 and a latch, particularly a toggle flip-flop 408. The toggle flip-flop 408 includes an output for providing a clock signal (CLK) to downstream circuitry and an input for receiving a control signal (CNTR) from the switching module 406. The switching module 406 includes a PMOS transistor 422, a capacitor 450, a NMOS transistor 424, a control module 482 including a PMOS transistor 426, and an NMOS transistor 420. The switching module 406 further includes an inverter 428 and a node 440. The transistor 422 includes a first current electrode connected to a voltage reference ($V_{dd}$), a control electrode connected to the output of the current source, and a second current electrode. The capacitor 450 includes a first electrode connected to the second current electrode of the transistor 422 and a second electrode connected to a voltage reference (ground). The transistor 424 includes a first current electrode connected to the first electrode of the capacitor 450, a control electrode, and a second current electrode connected to the ground voltage reference.

The transistor 426 of the control module 482 includes a first current electrode connected to a voltage reference ($V_{dd}$), a control electrode connected to the output of the current source, and a second current electrode. The transistor 420 of the control module 482 includes a first current electrode connected to the second current electrode of the transistor 426, a control electrode connected to the first current electrode of the transistor 424 and the first electrode of the capacitor 450, and a second current electrode connected to a voltage reference (ground). The inverter 428 has an input connected to an output of the control module 482, and an output. The node 440 connects the output of the inverter 428 and the control electrode of the transistor 424.

The operation of the oscillation module 404 will be better understood with reference to FIG. 5. FIG. 5 provides a timing diagram illustrating operation of the device of FIG. 4 in accordance with one embodiment of the present disclosure. FIG. 5 includes a capacitor voltage signal 502, a control signal 504, and a clock signal 506. During operation, the switching module 406 draws a current $I_S$ based on a voltage $V_{CM}$ provided by a current source via current mirrors having transistors 422 and 426 which include current electrodes connected to voltage references ($V_{dd}$). The capacitor 450 is charged via the current $I_S$, until it reaches a threshold voltage ($V_{TH}$), during period P1. When the capacitor 450 reaches the threshold voltage ($V_{TH}$), the transistor 420 of the control module 482 becomes conductive, and current flows from the voltage reference ($V_{dd}$) through the transistors 426 and 420 to the voltage reference (ground). Accordingly, the control module 482 provides a logic-low signal to the inverter 428. The logic-low signal provided to inverter 428 is inverted to a logic-high signal and output by inverter 428 to the node 440.

The logic-high signal at node 440 is provided to the input of the toggle flip-flop 408 as the control signal 504. As illustrated in FIG. 5, in response to the capacitor voltage signal 502 reaching the threshold voltage ($V_{TH}$) the control signal 504 changes from a low state to a high state.

The control signal 504 is provided to the input of the toggle flip-flop 408 and the control electrode of transistor 424. In response, the transistor 424 becomes conductive and the voltage charged to the capacitor 450 is discharged via the transistor 424, and the capacitor voltage signal 502 returns to a level below the threshold voltage ($V_{TH}$), during period P1 as illustrated in FIG. 5. In response to the capacitor voltage returning to a voltage level below the threshold voltage ($V_{TH}$), the transistor 420 of the control module 482 becomes non-conductive, and the control signal 504 is changed from the high state to a low state during period P1 as illustrated in FIG. 5. As the control signal 504 changes from a high state to a low state, the toggle flip-flop 408 is toggled on the falling edge of the control signal 504, and the clock signal 506 from the output of the toggle flip-flop 408 is changed from a low state to a high state at the end of period P1. This change in the clock signal 506 from the output of the toggle flip-flop 408 is provided to downstream circuitry as a change in the clock frequency.

Again, the capacitor 450 is charged via the current $I_S$, until it reaches a threshold voltage ($V_{TH}$), during period P2. Accordingly, the operation of the oscillation module 404 during period P2 is repeated as it occurred during period P1. The capacitor 450 is charged to a threshold voltage ($V_{TH}$), and in response, the transistor 420 of the control module 482 becomes conductive such that a current flows from the voltage reference ($V_{dd}$) through the transistors 426 and 420 to the voltage reference (ground). As such, the control module 482 provides a logic-low signal to the inverter 428. The inverter 428 inverts the logic-low signal to a logic-high signal and outputs the logic-high signal to the node 440. The logic-high signal received at the node 440 is provided to the control electrode of the transistor 424 and to the input of the toggle flip-flop 408 as a control signal 504. In response, the transistor 424 becomes conductive and the voltage across the capacitor 450 is discharged such that the voltage (Vc) is reduced to a value below the threshold voltage ($V_{TH}$). Accordingly, the transistor 420 of the control module 482 becomes non-conductive, and provides a logic-high signal to the inverter 428. Inverter 428 inverts the logic-high signal to a logic-low signal and accordingly the control signal 504 is changed from a high state to a low state, at the end of period P2 as illustrated in FIG. 5. In response to the control signal 504 changing from the high state to the low state, the toggle flip-flop 408 toggles and changes the clock signal 506 from a high state (which was maintained for the duration of period P2) to a low state. The low state of the clock signal 506 is maintained for the duration of a period P3.

Transistor 420 is matched with a transistor within the current source, such as transistor 310 of FIG. 3, so that as the current $I_S$ changes in response to temperature, the threshold voltage of the transistor 420 also changes. This may be better understood with reference to FIG. 6. FIG. 6 provides a diagram 600 illustrating the operation of the device of FIG. 4 at two different temperatures. Generally, the diagram demonstrates that given two different temperatures (T1 and T2) the threshold voltage ($V_{TH}$ T1 or $V_{TH}$ T2) necessary to make transistor 420 conductive, changes. Because transistor 420 is matched with a transistor within the current source, the matched transistors have a commensurate change in the threshold voltage, and the time ($t_{clk}$) necessary to charge the capacitor 450 to the corresponding threshold voltage is not changed. Therefore, the clock signal output by the toggle flip-flop 408 is substantially independent of temperature.

In detail, the diagram 600 includes a first plot line 606 and a second plot line 604. The first plot line 606 represents the voltage across the capacitor 450 as a function of time at a temperature, T1. The second plot line 604 represents the voltage across the capacitor 450 as a function of time at a temperature, T2. According to the first plot line 606, the capacitor 450 is charged to a threshold voltage ($V_{TH}$ T1) which is sufficient to make the transistor 420 conductive at a temperature T1. As described above, when the transistor 420 becomes conductive, the switching module 406 transmits a logic-based signal as the control signal (CNTR) to the toggle flip-flop 408, which results in a clock signal (CLK) output from the toggle flip-flop 408.

Assuming a temperature change from T1 to T2, the current value $I_S$ changes as a result of the change in temperature. However, the threshold voltage of the transistor 420 also changes from $V_{TH}$ T1 to $V_{TH}$ T2; a change commensurate with the change of the threshold voltage of a transistor within the current source to which transistor 420 is matched. Therefore, despite the change in temperature, the time ($t_{clk}$) necessary to charge the capacitor 450 to $V_{TH}$ T2 is substantially the same as the time ($t_{clk}$) to charge the capacitor 450 to $V_{TH}$ T1. Accordingly, the time ($t_{clk}$) necessary to make the transistor 420 conductive is substantially insensitive to a temperature change. Moreover, the time at which the switching module 406 sends a control signal (CNTR) to the toggle flip-flop 408 is substantially insensitive to a temperature change. And accordingly, the frequency of the clock signal (CLK) output by the toggle flip-flop 408 is substantially insensitive to a temperature change. The period P1 of the clock signal CLK is defined by:

$$P_1 \cong \frac{V th310}{I_S} \cdot C_{450}$$

where $C_{450}$ is the capacitive value of the capacitor 450 and $V_{th310}$ is the threshold voltage for the transistor 310 of FIG. 3. The frequency of the clock signal CLK 404 is set forth in the following equation:

$$f \cong \frac{1}{2 \cdot P_1}$$

Figure 7:
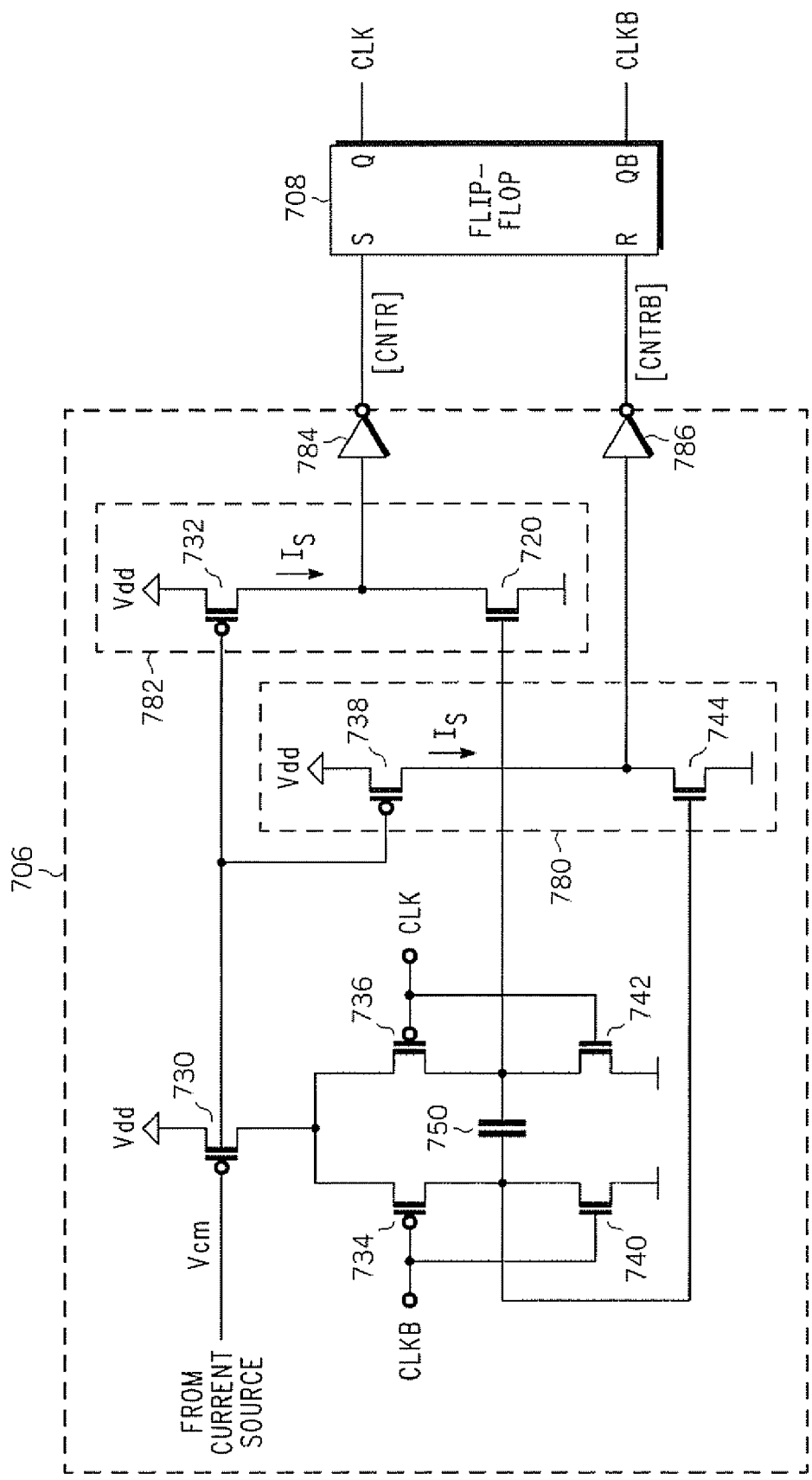
FIG. 7 is a circuit and block diagram illustrating a particular embodiment of the oscillation module of FIG. 2.

Referring to FIG. 7, a block diagram illustrating a particular embodiment of the oscillation module is provided. The device 700 includes a switching module 706 and set-reset flip-flop (SR flip-flop) 708. The SR flip-flop 708 includes a first output for outputting a clock signal (CLK), a second output for outputting a clock signal (CLKB), a first input for receiving a first control signal (CNTR) from the switching module 706, and a second input for receiving a second control signal (CNTRB) from the switching module 706.

The switching module 706 includes a PMOS transistor 730, a PMOS transistor 734, a PMOS transistor 736, a capacitor 750, a NMOS transistor 740, and a NMOS transistor 742. Transistor 730 includes a first current electrode connected to a voltage reference ($V_{dd}$), a control electrode connected to a current source, and a second current electrode. Transistor 734 includes a first current electrode connected to the second current electrode of transistor 730, a control electrode connected to the second output of the SR flip-flop 708 for receiving the second clock signal (CLKB), and a second current electrode. Transistor 736 includes a first current electrode connected to the second current electrode of transistor 730, a control electrode connected to the first output of the SR flip-flop 708 for receiving the first clock signal (CLK), and a second current electrode. The capacitor 750 has a first electrode connected to the second current electrode of transistor 734, and a second electrode connected to the second current electrode of transistor 736. Transistor 740 includes a first current electrode connected to the first electrode of the capacitor 750 and the second current electrode of the transistor 734, a control electrode connected to the second output of the SR flip-flop 708 for receiving the second clock signal (CLKB), and a second current electrode connected to a voltage reference (ground). Transistor 742 has a first current electrode connected to the second current electrode of the capacitor 750 and the second current electrode of the transistor 736, a control electrode connected to the output of the SR flip-flop 708 to receive the first clock signal (CLK), and a second current electrode connected to a voltage reference (ground).

The switching module 706 further includes a control module 780, a control module 782, an inverter 784, and an inverter 786. The control module 780 includes a PMOS transistor 738 and a NMOS transistor 744. Transistor 738 includes a first current electrode connected to a voltage reference ($V_{dd}$), a control electrode connected to the current source, and a second current electrode. Transistor 744 includes a first current electrode connected to the second current electrode of transistor 738, a control electrode connected to the first current electrode of transistor 740 and the first electrode of the capacitor 750, and a second current electrode connected to a voltage reference (ground). The inverter 786 has an input connected to the output of control module 780 and an output connected to the second input of the SR flip-flop 708.

The control module 782 includes a PMOS transistor 732 and a NMOS transistor 720. Transistor 732 includes a first current electrode connected to a voltage reference ($V_{dd}$), a control electrode connected to the current source, and a second current electrode. Transistor 720 includes a first current electrode connected to the second current electrode of transistor 732, a control electrode connected to the second electrode of capacitor 750, and a second current electrode connected to a voltage reference (ground). The inverter 784 includes an input connected to the output of the control module 782 and an output connected to the first input of the SR flip-flop 708.

Figure 8:
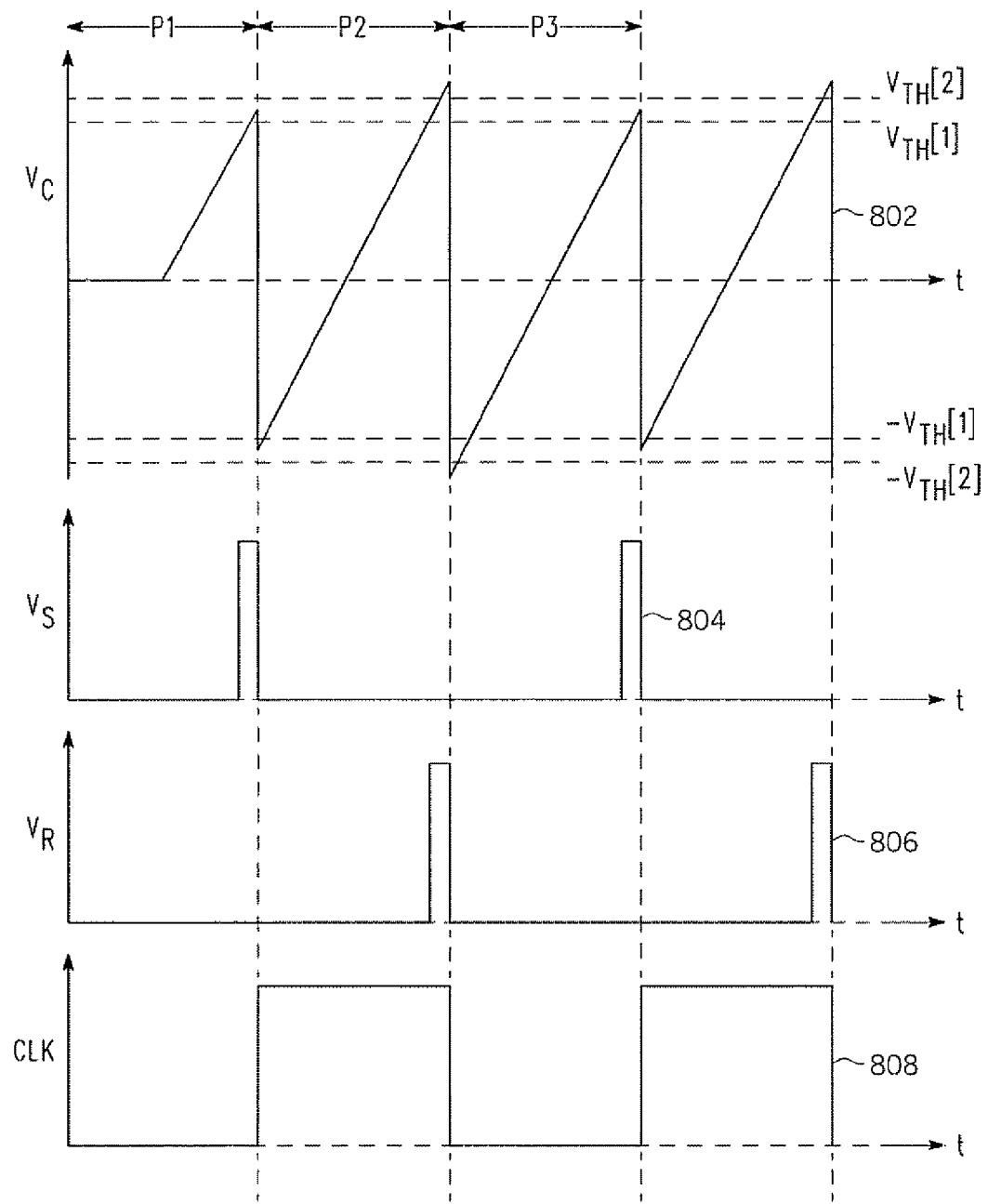
FIG. 8 is a timing diagram illustrating a particular embodiment of the operation of the switching module of FIG. 7.

The operation of the device 700 of FIG. 7 can be better understood with reference to FIG. 8. FIG. 8 is a timing diagram illustrating a particular embodiment of the operation of the switching module of FIG. 7. FIG. 8 includes a capacitor voltage signal 802, a voltage output signal 804, a voltage output signal 806, and a clock signal 808. In reference to FIG. 8, during period P1, the clock signal 808 is initially in a logic-low state, and thus transistor 736 is conductive. The voltage $V_{CM}$ is provided to the control electrode of transistor 730, so that the current $I_S$ is provided through transistor 736, and to the second electrode of the capacitor 750. As indicated by the capacitor signal in FIG. 8, the capacitor is charged to a threshold voltage $V_{TH}[1]$, which is sufficient to make the transistor 720 of the control module 782 conductive. Accordingly, a current flows from the voltage reference ($V_{dd}$) to the ground voltage reference connected to transistor 720 and the control module 782 outputs a logic-high signal. The logic-high signal is inverted by the control module 782 to a logic-low signal and transmitted to the inverter 784, where the signal is inverted again to a logic-high signal. The inverter 784 provides a delay. In response, the voltage output signal 804 is changed from a low state to a high state and transmitted to the SR flip-flop 708 which in response, changes the first clock output (CLK) from a low state to a high state, and the second clock output (CLKB) is changed from a high state to a low state. Accordingly, the transistor 736 becomes non-conductive, transistor 742 becomes conductive, transistor 734 becomes conductive, and transistor 740 becomes non-conductive. This change reverses the current flow to the capacitor 750, such that current flows from transistor 730, through transistor 734, and to the first electrode of the capacitor 750. The reversal of current flow to the capacitor 750 results in a change of polarity to the capacitor 750, as indicated by the change of the capacitor voltage signal 802 from the threshold voltage $V_{TH}[1]$ to a threshold voltage value $-V_{TH}[1]$.

Also, in response to the change in polarity across the capacitor 750, the transistor 720 of the control module 782 becomes non-conductive, and the voltage output signal 804 changes from a high state to a low state. This change corresponds to the clock signal 808 changing from a low state to a high state at the end of period P1. This high state of the clock signal (CLK) 808 is held for the duration of period P2.

Referring to period P2 illustrated in FIG. 8, the voltage $V_{CM}$ is provided to the control electrode of transistor 730 so that the current $I_S$ is provided to the transistor 734, and to first electrode of the capacitor 750. The capacitor 750 is charged from the threshold voltage value $-V_{TH}[1]$ to a threshold voltage $V_{TH}[2]$ which is a sufficient voltage to make the transistor 744 of the control module 780 conductive, which causes a current to flow from the voltage reference ($V_{dd}$) through the transistors 738 and 744 to the ground voltage reference. Accordingly, a logic-high signal is transmitted to the control module 780 and inverted to a logic-low signal. The logic-low signal is output from the control module 780 to the inverter 786 and inverted to a logic-high signal. The inverter 786 also provides a delay. In response, the voltage output signal 806 is changed from a low state to a high state and input to the second input of the SR flip-flop 708. In response to this input, the second clock output (CLKB) of the SR flip-flop 708 is changed from a low state to a high state, and the first clock output (CLK) of the SR flip-flop 708 is changed from a high state to a low state. Accordingly, the transistor 734 becomes non-conductive, transistor 740 becomes conductive, transistor 736 becomes conductive, and transistor 742 becomes non-conductive. In response, the current flow to the capacitor 750 is reversed such that current flows from transistor 730, through transistor 736, and to the second electrode of the capacitor 750. The reversal of current flow to the capacitor 750 results in a change of polarity to the capacitor 750, as indicated by the change of the capacitor voltage signal 802 from the threshold voltage $V_{TH}[2]$ to a threshold voltage value $-V_{TH}[2]$.

Also, in response to the change in polarity across the capacitor 750, the transistor 744 of the control module 780 becomes non-conductive, and the voltage output signal 806 changes from a high state to a low state, and accordingly the clock signal 808 changes from a high state to a low state at the end of period P2. This low state of the clock signal (CLK) 808 is held for the duration of period P3.

After the end of period P2, period P3 is initiated as illustrated in FIG. 8. During period P3, the current flows to the capacitor 750 as it did during period P1; from the transistor 730, through the transistor 736, and to second electrode of the capacitor 750. As such, the capacitor 750 is charged from the threshold voltage value $-V_{TH}[2]$ to a threshold voltage $V_{TH}[1]$, such that transistor 720 becomes conductive and a logic-high signal is provided to the control module 782, where it is inverted to a logic-low signal. The logic-low signal is transmitted to the inverter 784 and inverted to a logic-high signal as indicated by the voltage output signal 804. In response to the voltage output signal 804 changing from a low state to a high state, the first clock output signal (CLK) is changed from a low state to a high state, and the second clock output signal (CLKB) is changed from a high state to a low state. Accordingly, the transistor 736 becomes non-conductive, the transistor 742 becomes conductive, the transistor 734 becomes conductive, and the transistor 740 becomes non-conductive. These changes cause the current flow to the capacitor 750 to be reversed such that current flows from the transistor 730, through the transistor 734, and to the first electrode of the capacitor 750. The reversal of current flow to the capacitor 750 results in a change of polarity to the capacitor 750, as indicated by the change of the capacitor voltage signal 802 from the threshold voltage $V_{TH}$ [1] to a threshold voltage value $-V_{TH}$ [1].

In response to the change in polarity across the capacitor 750, the transistor 720 of the control module 782 becomes non-conductive, and the voltage output signal 804 changes from a high state to a low state. Accordingly, the clock signal 808 changes from a low state to a high state at the end of period P3, and this state is held for a duration of the next interval.

As illustrated by FIG. 8, the difference in voltage values between $-V_{TH}$ [1] and $V_{TH}$ [2] is substantially the same as the difference in voltage values between $-V_{TH}$ [2] and $V_{TH}$ [1]. Accordingly, because these differences in voltage values are substantially identical, the time necessary to charge the capacitor voltage signal 802 to a threshold voltage is substantially identical. Accordingly, periods P2 and P3 have substantially identical durations and the frequency of the clock signal 808 is consistent. Notably, the transistor 744 and the transistor 720 are matched with a transistor within the current source, such that the transistor 720 has the same operational parameters, such as threshold voltage, as a transistor within the current source.

The operation of the device 700 of FIG. 7 can be better understood with reference to FIG. 9. FIG. 9 provides a diagram 900 illustrating the operation of the device of FIG. 7 at two different temperatures. The diagram 900 demonstrates that given two different temperatures (T1 and T2) the threshold voltage ($V_{TH}$ T1 or $V_{TH}$ T2) necessary to make the transistor 720 or the transistor 744 conductive, changes. Because the transistors 720 and 744 are matched with a transistor within the current source, the matched transistors have a commensurate change in the threshold voltage, and the time ($t_{clk}$) necessary to charge the capacitor 750 to the corresponding threshold voltage (either $V_{TH}$ T1 or $V_{TH}$ T2) is not changed. Therefore, the clock signal (CLK) output by the SR flip-flop 708 is substantially independent of temperature.

In detail, the diagram 900 includes a first plot line 902 and a second plot line 904. The first plot line 902 represents the voltage across the capacitor 750 as a function of time at a temperature, T1. The second plot line 904 represents the voltage across the capacitor 750 as a function of time at a temperature, T2. According to the first plot line 902, the capacitor 750 is charged from a threshold voltage of $-V_{TH}$ T1 to a threshold voltage of $V_{TH}$ T1, which depending upon the polarity across the capacitor 750 is sufficient to make either the transistor 720 or the transistor 744 conductive at a temperature T1. When the transistor 720 becomes conductive, the switching module 706 transmits a logic-based signal to the first input of the SR flip-flop 708 as the first control signal (CNTR). This results in a change in the polarity across the capacitor 750, which results in the transistor 720 becoming non-conductive and as such the clock signal (CLK) from the first output of the SR flip-flop 708 is changed to a high state.

Assuming a temperature change from T1 to T2, according to the second plot line 904, the current value from the current source changes as a result of the change in temperature. The capacitor 750 must be charged from a threshold voltage of $-V_{TH}$ T2 to a threshold voltage of $V_{TH}$ T2 in order for the transistor 720 (or transistor 744 depending upon the polarity of the capacitor 750) to become conductive. The change in threshold voltage of the transistor 720 is a change commensurate with the change of the threshold voltage of the transistor 310 within the current source to which transistor 720 is matched. Accordingly, the voltage $V_{CM}$, and therefore the current $I_S$, changes as a result of the temperature change commensurate with the change in the threshold voltage. Therefore, despite the change in temperature from T1 to T2, the time ($t_{clk}$) necessary to charge the capacitor 750 to a threshold voltage at the second temperature ($V_{TH}$ T2) in order to make the transistor 720 conductive, is substantially identical to the time ($t_{clk}$) to charge the capacitor 750 to a threshold voltage at the first temperature ($V_{TH}$ T1). Accordingly, the time ($t_{clk}$) necessary to make the transistor 720 conductive is substantially insensitive to a temperature change. Moreover, the time at which the switching module 706 sends a control signal (CNTR) to the first input of the SR flip-flop 708 is substantially insensitive to a temperature change. And accordingly, the frequency of the clock signal (CLK) output by the SR flip-flop 708 is substantially insensitive to a temperature change. The period P2 (and P3) of the clock signal CLK is defined by:

$$P_2 \cong \frac{Vth744}{Is} \cdot C_{750}$$

where $C_{750}$ is the capacitive value of the capacitor 750 and $V_{th744}$ is the threshold voltage of the transistor 744. The frequency of the clock signal CLK is set forth in the following equation:

$$f \cong \frac{1}{4 \cdot P_2}$$

It will be appreciated that the current source can respond to changes in temperature in different ways. In one embodiment, the current may increase with increasing temperature, and as such the current source will be a device that responds positively to absolute temperature (PTAT). Alternatively, the current may decrease with increasing temperature, and accordingly the current source will be device that responds complementary to absolute temperature (CTAT).

The operation of the devices illustrated in FIG. 4 and FIG. 7 can be better understood with reference to FIG. 10. FIG. 10 provides a plot 1000 illustrating clock frequencies as a function of temperature according to one embodiment. FIG. 10 includes plot line 1001, plot line 1002, plot line 1003, plot line 1004, and plot line 1005. Each of the plot lines 1001-1005, illustrates the results of tested oscillation modules in accordance with embodiments herein. As illustrated in FIG. 5, the oscillation modules described in embodiments herein provide a clock signal frequency that is substantially independent of temperature variations. The oscillation modules provide a frequency variation of less than about 3.0 kHz, and particularly less than about 2.0 kHz, over a range of temperatures from between about −40° C. to about 120° C.

Each of the plot lines 1001-1005 illustrate a variation of the frequency of the clock signal (CLK) output by the flip-flop over a range of temperatures from between −40° C. to about 120° C., at a voltage of 3.3 V. Plot line 1001 illustrates an initial clock signal (CLK) frequency of about 22 kHz at about −40° C. and a clock signal frequency of about 23 kHz at about 120° C. Plot line 1002 illustrates a change in the clock signal (CLK) frequency of about 27.5 kHz to about 26 kHz for the range of temperatures. Plot line 1003 illustrates an initial clock signal (CLK) frequency of about 28 kHz at about −40° C. and a clock frequency of about 27 kHz at about 120° C. Plot line 1004 illustrates a change in the clock signal (CLK) frequency from about 29 kHz to about 31 kHz for the range of temperatures. Plot line 1005 illustrates a clock signal (CLK) frequency of about 36.5 kHz at about −40° C. and a clock signal (CLK) frequency of about 36 kHz at about 120° C. Based upon the foregoing, the oscillation devices described herein are capable of providing a clock output frequency substantially independent of temperature variations.

In accordance with embodiments herein, the devices described can be utilized as relaxation oscillation devices. Particularly, such oscillation devices are intended for system on chip (SoC) applications. Moreover, the oscillation devices are suited for low power consumption applications, particularly applications relying upon limited power supplies, such as battery power supplies. In a particular embodiment, the current consumption of oscillation devices provided herein is less than about 8.0 micro amps, and particularly less than about 5.0 micro amps. Such current consumption values are based upon voltages of not greater than about 3.3 V, or not greater than about 2.0 V, such as not greater than about 1.7 V, and even, not greater than about 1.5 V. Still, the oscillation devices demonstrate an extended voltage supply range, capable of utilizing voltages within a range of between about 1.5 V to about 6.0 V. Moreover, the oscillation devices typically have a power dissipation of less than about 10 micro Watts, such as less than about 8.0 micro Watts.

In reference to the embodiments provided herein, oscillator devices and methods for operating said oscillator devices are provided. Particularly, devices and methods are provided which include a combination of features, representing a departure from conventional techniques. Notably, the devices and techniques provided herein include utilization of capacitors, inverters, flip-flops, and transistors, including matched transistors in a particular architecture to reduce inconsistencies in the frequency of the clock signals generated. Additionally, the embodiments herein utilize resistors within a current source, which when exposed to a temperature change have complementing changes in resistance values, and as such provide a consistent resistance value which results in reduced changes in the current of the current source due to temperature changes. While some embodiments herein disclose particular features and arrangements of the oscillator device, using the guidelines provided herein, those skilled in the art can implement the oscillator system and techniques in other contexts without departing from the scope of the present disclosure. Moreover, it shall be appreciated that all circuitry described herein may be implemented either in silicon or another semiconductor material or alternatively by software code representation of silicon or another semiconductor material.

Other embodiments, uses, and advantages of the disclosure will be apparent to those skilled in the art from consideration of the specification and practice of the disclosure disclosed herein. As used herein, the terms "low state" and "high state" are used to represent a change in a signal between values, such as a charge value, and not only those values including positive and negative charges, but also charges having no charge value or effectively a zero charge value. It will further be appreciated that, although some circuit elements are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A method comprising:
    applying a first current to charge a capacitor to a first voltage level during a first interval, the first voltage level dependent on a first threshold voltage;
    generating a first clock signal interval in response to the capacitor charge reaching the first threshold voltage;
    reversing a polarity of the capacitor in response to the capacitor charge reaching the first threshold voltage during the first interval;
    applying the first current to charge the capacitor to a second voltage level during a second interval, the second voltage level dependent on a second threshold voltage; and
    generating a second clock signal interval in response to the capacitor charge reaching the second threshold voltage.

2. The method of claim 1, wherein generating the first clock signal comprises:
    asserting a first signal based on a charge of the capacitor;
    applying the first signal to a first input of a flip-flop;
    asserting a second signal based on the charge of the capacitor; and
    applying the second signal to a second input of the flip-flop.

3. The method of claim 1, wherein generating the first clock signal comprises providing a first current to a first inverter in response to the capacitor charge reaching the first threshold voltage.

4. The method of claim 3, further comprising providing an inverted representation of a signal from the first inverter to an input of a latch.

5. The method of claim 4, wherein the latch comprises a set-reset flip flop.

6. The method of claim 5, wherein generating the first clock signal comprises providing a second current to a second inverter in response to switching the polarity of the capacitor.

7. The method of claim 1, further comprising reversing the polarity of the capacitor in response to the capacitor charge reaching the second threshold voltage during the second interval.

8. A device, comprising
    a current source comprising:
        a first transistor comprising a first current electrode coupled to a first voltage reference, a second current electrode coupled to a second voltage reference, and a control electrode coupled to the second voltage reference;
        a second transistor comprising a first current electrode coupled to the first voltage reference, a second current electrode coupled to the control electrode of the first transistor, and a control electrode coupled to the first current electrode of the first transistor; and
        an output coupled to the first current electrode of the first transistor;
    a switching module comprising:
        a capacitor comprising a first current electrode responsive to a voltage at the output of the current source during a first interval and a second current electrode responsive to a voltage at the output of the current source during a second interval; and
        a first control module comprising a third transistor that is matched with the first transistor, the third transistor comprising a first current electrode coupled to the first voltage reference, a second current electrode coupled to the second voltage reference, and a control electrode coupled to the first current electrode of the capacitor;

a second control module comprising a fourth transistor that is matched with the first transistor, the fourth transistor comprising a first current electrode coupled to the first voltage reference, a second current electrode coupled to the second voltage reference, and a control electrode coupled to the second current electrode of the capacitor; and a latch comprising a first input coupled to the first current electrode of the third transistor, a second input coupled to the first current electrode of the fourth transistor, and a first output configured to provide a periodic signal based on a first signal at the first input and a second signal at the second input.

9. The device of claim 8, wherein the switching module further comprises:

a fifth transistor comprising a first current electrode coupled to the first voltage reference, a second current electrode coupled to the second current electrode of the capacitor, and a control electrode coupled to a second output of the latch; and a sixth transistor comprising a first current electrode coupled to the first voltage reference, a second current electrode coupled to the first current electrode of the capacitor, and a control electrode coupled to the first output of the latch.

10. The device of claim 9, wherein the switching module further comprises:

a seventh transistor comprising a first current electrode coupled to the second current electrode of the capacitor, a second current electrode coupled to the second voltage reference, and a control electrode coupled to the second output of the latch; and an eighth transistor comprising a first current electrode coupled to the first current electrode of the capacitor, a second current electrode coupled to the second voltage reference, and a control electrode coupled to the first output of the latch.

11. The device of claim 8, wherein the latch is a set-reset flip flop.

12. The device of claim 8 further comprising a plurality of resistors coupled in series between the second current electrode of the second transistor and the second voltage reference.

13. The device of claim 12 wherein a first of the plurality of resistors comprises a N doped poly resistor and a second of the plurality of resistors is a P doped poly resistor.

14. The device of claim 8, wherein the first, second and third transistors are CMOS transistors.

* * * * *